United States Patent
Zhou (10) Patent No.: US 11,784,658 B2
(45) Date of Patent: Oct. 10, 2023

(54) SUCCESSIVE APPROXIMATION REGISTER ANALOG TO DIGITAL CONVERTER AND SIGNAL CONVERSION METHOD

(71) Applicant: REALTEK SEMICONDUCTOR CORPORATION, Hsinchu (TW)

(72) Inventor: Xiao-Bo Zhou, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 22 days.

(21) Appl. No.: 17/696,446

(22) Filed: Mar. 16, 2022

(65) Prior Publication Data
US 2022/0399898 A1    Dec. 15, 2022

(30) Foreign Application Priority Data
Jun. 11, 2021   (CN) ................. 202110654962.9

(51) Int. Cl.
H03M 1/38       (2006.01)
H03M 1/46       (2006.01)
H03M 1/12       (2006.01)

(52) U.S. Cl.
CPC ......... *H03M 1/466* (2013.01); *H03M 1/1245* (2013.01)

(58) Field of Classification Search
CPC ............................ H03M 1/466; H03M 1/1245
(Continued)

(56) References Cited

U.S. PATENT DOCUMENTS

| 2015/0249463 A1* | 9/2015 | Alladi | H03M 1/1245 341/172 |
| 2017/0093414 A1 | 3/2017 | Sun et al. | |

(Continued)

OTHER PUBLICATIONS

OA letter of a counterpart TW application (appl. No. 110124846) mailed on Nov. 25, 2021.Summary of the OA letter: 1. Claims 1-2, 5-8, and 10 are alleged to be unpatentable over cited reference (US 2017/0093414 A1) in view of cited reference (US 2019/0123758 A1). 2. Claims 3, 4, and 9 are allowable. Correspondence bewteen claims of TW counterpart application and claims of US application: 1. Claims 1-9 and 10 in TW counterpart application correspond to claims 1-9 and 11 in US application, respectively.

(Continued)

*Primary Examiner* — Peguy Jean Pierre
(74) *Attorney, Agent, or Firm* — WPAT, PC (57) ABSTRACT

A successive approximation register analog to digital converter includes a sampling circuitry, a comparator circuit, and a controller circuitry. The sampling circuitry generates first and second signals according to a sampled signal. The comparator circuit compares the first signal with the second signal to generate first decision signals. The controller circuitry generates digital codes according to the first decision signals, and controls the comparator circuit to perform comparisons repeatedly to generate second decision signals, in order to generate a digital output according to the digital codes, a statistical noise value, and the second decision signals. The controller circuitry further controls the sampling circuitry and the comparator circuit to perform comparisons repeatedly according to the sampled signal having an initial level during an initial phase, in order to generate third decision signals, and performs a statistical calculation to obtain the statistical noise value according to the third decision signals.

20 Claims, 7 Drawing Sheets

(58) Field of Classification Search
USPC .............. 341/144, 155, 161, 120, 118, 172
See application file for complete search history.

(56) References Cited

U.S. PATENT DOCUMENTS

2018/0309408 A1* 10/2018 Sun .................... H03F 3/45475
2019/0123758 A1    4/2019 Vinje
2021/0135596 A1*  5/2021 Tsuji ................... H02M 7/537

OTHER PUBLICATIONS

L. Chen, X. Tang, A. Sanyal, Y. Yoon, J. Cong and N. Sun, "A 0.7-V 0.6-µW 100-kS/s Low-Power SAR ADC With Statistical Estimation-Based Noise Reduction," in IEEE Journal of Solid-State Circuits, vol. 52, No. 5, pp. 1388-1398, May 2017, doi: 10.1109/JSSC.2017.2656138.

B. Verbruggen, J. Tsouhlarakis, T. Yamamoto, M. Iriguchi, E. Martens and J. Craninckx, "A 60 dB SNDR 35 MS/s SAR ADC With Comparator-Noise-Based Stochastic Residue Estimation," in IEEE Journal of Solid-State Circuits, vol. 50, No. 9, pp. 2002-2011, Sep. 2015, doi: 10.1109/JSSC.2015.2422781.

"Common families of distributions Chapter 3", p. 83-122, https://www.stat.purdue edu/~fmliang/STAT610/st610lect3.pdf, Purdue University.

* cited by examiner

SUCCESSIVE APPROXIMATION REGISTER ANALOG TO DIGITAL CONVERTER AND SIGNAL CONVERSION METHOD

BACKGROUND OF THE INVENTION

1. Field of the Invention

The present disclosure relates to an analog to digital converter. More particularly, the present disclosure relates to a successive approximation register analog to digital converter having a function of estimating practical noises and performing statistical calculation and a signal conversion method thereof.

2. Description of Related Art

A resolution of an analog to digital converter is usually limited by noises in the practical environment. In current approaches, a simulation is employed to estimate noise information about certain circuit(s) (e.g., a comparator) in the analog to digital converter, and a predetermined calculation is performed according to the noise information to increase the resolution of the analog to digital converter. However, the noises in the practical environment may include intrinsic noises (e.g., thermal noises and/or flicker noises, etc.) in other circuits, electromagnetic interference in the practical environment, or the like. Accordingly, the noise information generated by the simulation is insufficient to represent real noise information, such that the resolution of analog-to-digital converter is not improved significantly.

SUMMARY OF THE INVENTION

In some aspects, a successive approximation register analog to digital converter includes a sampling circuitry, a comparator circuit, and a controller circuitry. The sampling circuitry is configured to generate a first signal and a second signal according to a sampled signal. The comparator circuit is configured to compare the first signal with the second signal, in order to generate a plurality of decision signals. The controller circuitry is configured to generate a plurality of first digital codes according to the plurality of decision signals, and control the comparator circuit to generate the plurality of decision signals corresponding to a plurality of output comparison results, in order to generate a digital output according to the plurality of first digital codes, a statistical noise value, and the plurality of decision signals corresponding to the plurality of output comparison results. During an initial phase, the controller circuitry is further configured to control the sampling circuitry and the comparator circuit, such that the comparator circuit generates the plurality of decision signals corresponding to a plurality of estimated comparison results according to the sampled signal having an initial level, and the controller circuitry performs a statistical calculation according to the plurality of decision signals corresponding to the plurality of estimated comparison results, in order to obtain the statistical noise value.

In some aspects, a signal conversion method includes the following operations: during an initial phase, generating, by a successive approximation register analog to digital converter, a plurality of decision signals corresponding to a plurality of estimated comparison results according to a sampled signal having an initial level, and performing a statistical calculation according to the plurality of decision signals corresponding to the plurality of estimated comparison results, in order to obtain a statistical noise value; generating, by the successive approximation register analog to digital converter, a plurality of first digital codes and generating the plurality of decision signals corresponding to a plurality of output comparison results; and generating a digital output according to the plurality of first digital codes, the statistical noise value, and the plurality of decision signals corresponding to the plurality of output comparison results.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system implemented with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, similar/identical elements in various figures are designated with the same reference number.

Figure 1:
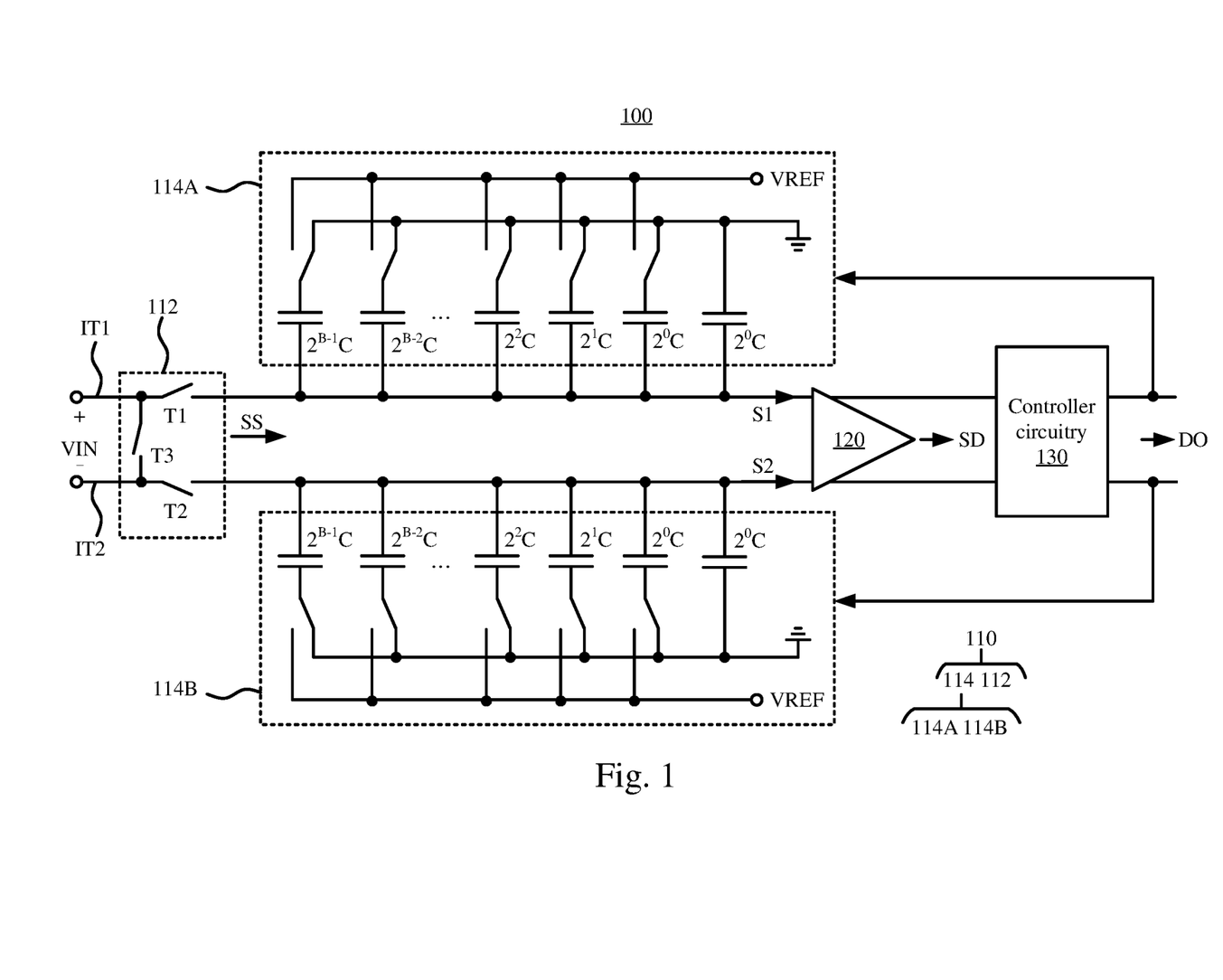
FIG. 1 is a schematic diagram of a successive approximation register (SAR) the analog to digital converter according to some embodiments of the present disclosure.

FIG. 1 is a schematic diagram of a successive approximation register (SAR) the analog to digital converter 100 (hereinafter referred to as "SAR analog to digital converter 100" for simplicity) according to some embodiments of the present disclosure. The analog to digital converter 100 includes a sampling circuitry 110, a comparator circuit 120, and a controller circuitry 130.

The sampling circuitry 110 is configured to generate a signal S1 and a signal S2 according to a sampled signal SS. In some embodiments, the sampling circuitry 110 includes a switch circuit 112 and a digital to analog converter circuit 114. The switch circuit 112 includes switches T1-T3. The switch T1 is coupled between an input terminal IT1 of the SAR analog to digital converter 100 and a first input terminal of the comparator circuit 120. The switch T2 is coupled to an input terminal IT2 of the SAR analog to digital converter 100 and a second input terminal of the comparator circuit 120. The switch T3 is coupled between the input terminal IT1 and the input terminal IT2. The input terminal IT1 and the input terminal IT2 are configured to receive an input signal VIN.

When the switch T1 and the switch T2 are turned on and the switch T3 is not turned on, the input signal VIN is outputted to be the sampled signal SS via the switch T1 and the switch T2. Under this condition, the SAR analog to digital converter 100 may converter the input signal VIN to be a corresponding digital output DO. Alternatively, when the switch T1, the switch T2, and the switch T3 are all turned on, the input terminal IT1 is coupled to the input terminal IT2. Under this condition, the input terminal IT1 and the input terminal IT2 are short-circuited, and the switch circuit 112 may output the sampled signal SS having an initial level.

In this example, the digital to analog converter circuit 114 may a capacitive digital to analog converter circuit. For example, the digital to analog converter circuit 114 includes a switching capacitor array 114A and a switching capacitor array 114B. The switching capacitor array 114A is coupled to the switch T1 and a first input terminal of the comparator circuit 120, and is configured to generate the signal S1 according to the sampled signal SS and the control of the controller circuitry 130. For example, the switching capacitor array 114A includes capacitors and switches. Capacitance values of the capacitors are C (labeled as $2^0$C), C, $2^1$C, $2^2$C, . . . , $2^{B-2}$C, and $2^{B-1}$C, in which, $2^0$, $2^1$, . . . , $2^{B-2}$, and $2^{B-1}$ indicate weights respectively corresponding to the capacitors, and the capacitor corresponding to the lowest weight (i.e., $2^0$) is fixedly coupled to ground. In some embodiments, the value B may be a positive integer. In some embodiments, the value B may indicate the resolution of the SAR analog to digital converter 100. The switches selectively transmit a ground voltage or the reference voltage VREF to a corresponding of the remaining capacitors based on the control of the controller circuitry 130. The capacitors may store the sampled signal SS, and generate the signal S1 based on the switching of the switches.

The switching capacitor array 114B is coupled to the switch T2 and a second input terminal of the comparator circuit 120, and is configured to generate a signal S2 according to the sampled signal SS and the control of the controller circuitry 130. The arrangements of the switching capacitor array 114B are similar to those of the switching capacitor array 114A, and thus the repetitious descriptions are not further given.

The comparator circuit 120 is configured to compare the signal S1 with the signal S2, in order to generate a decision signal SD. The controller circuitry 130 is configured to perform a binary search algorithm according to the decision signal SD, in order to generate the digital output DO. In greater detail, in the progress of the analog to digital conversion, the controller circuitry 130 determines one digital code of the digital output DO (e.g., digital code $d_{B-1}$) according to the decision signal SD, and switches the digital to analog converter circuit 114 accordingly. In response to the switching of the digital to analog converter circuit 114, the comparator circuit 120 compares the updated signal S1 with the signal S2, in order to generate a next decision signal SD. The controller circuitry 130 determines a next digital code of the digital output DO (e.g., digital code $d_{B-2}$) according to the decision signal SD, and switches the digital to analog converter circuit 114 accordingly. With this analogy, it should be understood that, in the progress of the analog to digital conversion, the comparator circuit 120 sequentially compares the signal S1 with the signal S2, in order to generate the decision signals SD corresponding to output comparison results (which are employed to generate the digital output DO). The controller circuitry 130 may generate first digital codes in the digital output DO (e.g., digital codes $d_{B-1}$, $d_{B-2}$, . . . , $d_1$, and $d_0$) according to those decision signals SD.

In some embodiments, the controller circuitry 130 is further configured to generate the complete digital output DO according to the first digital codes, a statistical noise value (e.g., statistical noise value the statistical noise value $\sigma_{noise}$ as discussed below) and the decision signals SD corresponding to the output comparison results. In some embodiments, the controller circuitry 130 may control the sampling circuitry 110 and the comparator circuit 120 during an initial phase (e.g., a predetermined interval after the SAR analog to digital converter 100 is powered on), such that the comparator circuit 120 generates the decision signals SD corresponding to estimated comparison results (which are for determining the statistical noise value) according to the sampled signal SS having the initial level, and the controller circuitry 130 may perform a statistical calculation according to the decision signals SD to obtain the statistical noise value. Operations regarding herein will be provided with reference to FIG. 2A to FIG. 3.

Figure 2A:
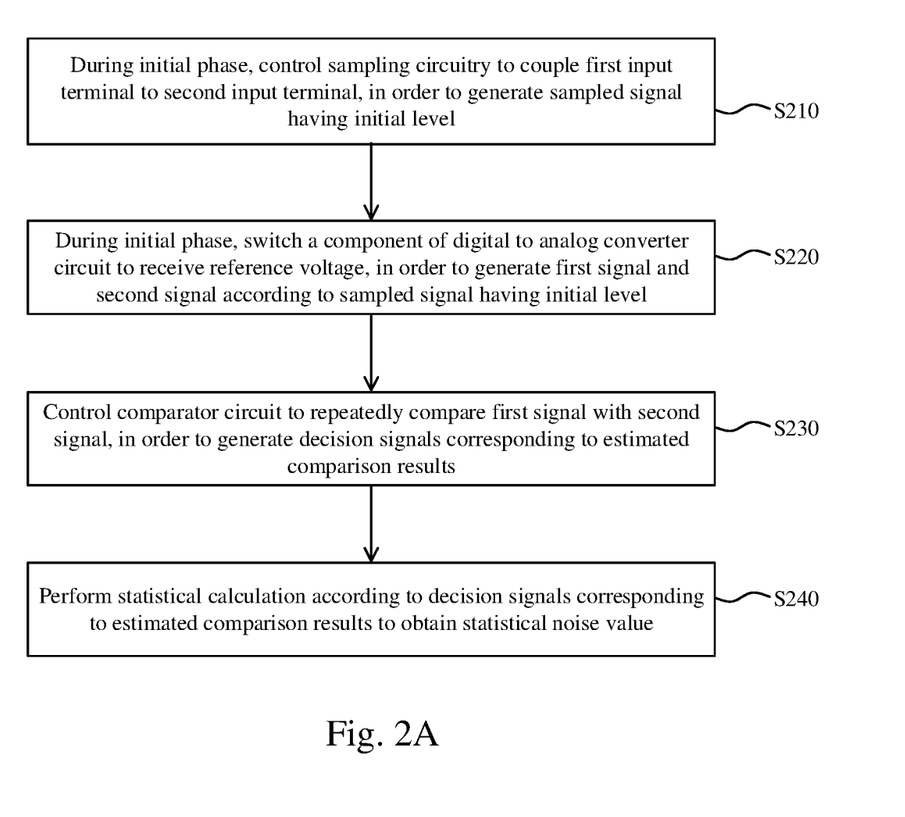
FIG. 2A is a flow chart of operations for generating the statistical noise value according to some embodiments of the present disclosure.
Figure 3:
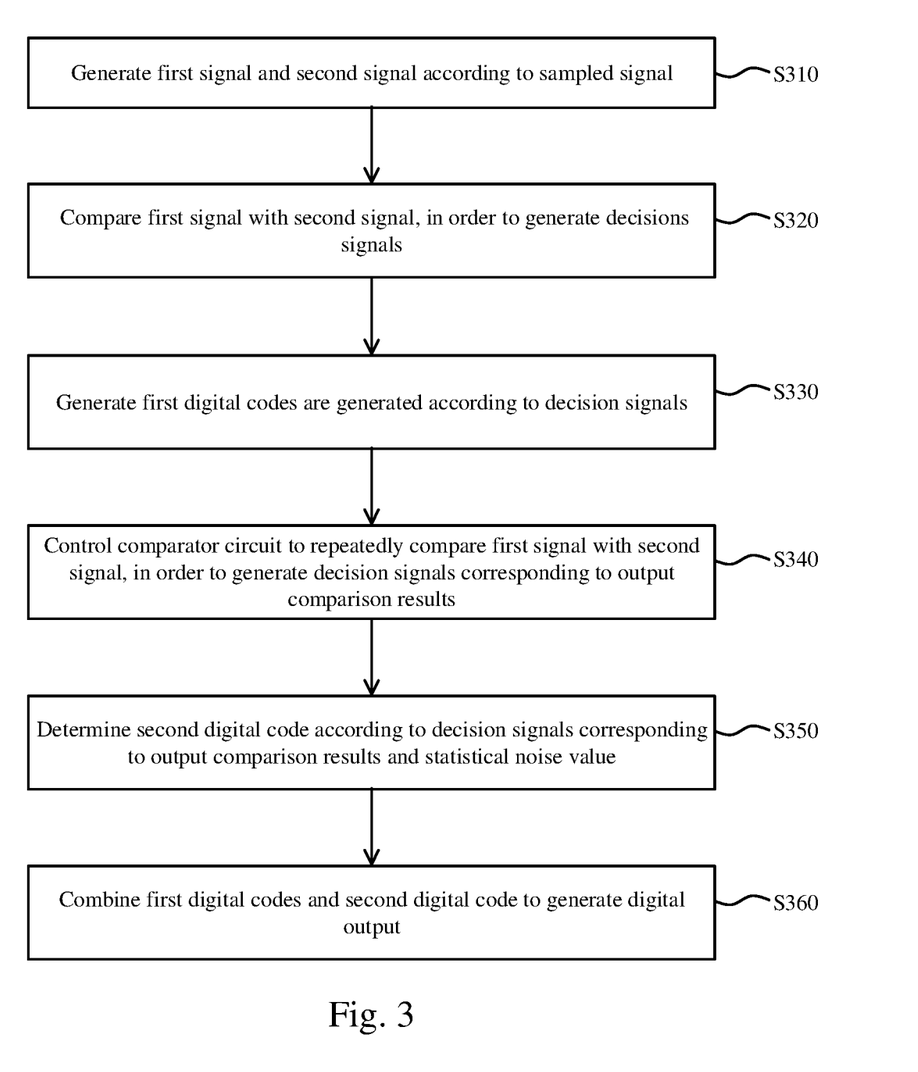
FIG. 3 is a flow chart of operations for generating the digital output in FIG. 1 according to some embodiments of the present disclosure.

In some embodiments, the controller circuitry 130 may be implemented with a digital signal processor circuit, a microcontroller circuit, and/or a digital control logic circuit, in which the digital signal processor circuit, the micro-controller circuit, and/or the digital control logic circuit may be configured to perform operations in FIG. 2A and FIG. 3. In some embodiments, the controller circuitry 130 further includes a memory circuit (not shown in the figure), which is configured to store information about the statistical noise value. In some embodiments, the controller circuitry 130 may include a first circuit portion and a second circuit portion, the first circuit portion is configured to perform the analog to digital conversion, and the second circuit portion is configured to perform the statistical calculation to generate the complete digital output DO. In some embodiments, the controller circuitry 130 may output control signals (not shown in FIG. 1) to control the switching of the switch circuit 112, and output another control signal (not shown in FIG. 1) to control the timing of the comparator circuit 120.

For example, the controller circuitry 130 may output a first control signal to control the comparison or the reset of the comparator circuit 120, and the comparator circuit 120 may output a second control signal to notify the controller circuitry 130 that the comparison or the reset has been completed. When the first control signal is switched from a first logic value to a second logic value, the comparator circuit 120 may starting comparing. When the comparator circuit 120 finishes comparing to generate the corresponding decision signal SD, the comparator circuit 120 may output the second control signal having the second logic value, in order to notify the controller circuitry 130 that the comparison has been completed. The controller circuitry 130 may store the current decision signal SD and switch the first control signal from the second logic value to the first logic value. In response to the first logic value having the first logic value, the comparator circuit 120 is reset, such that levels of internal nodes in the comparator circuit 120 is restored to predetermined levels. When the reset of the comparator circuit 120 is completed, the comparator circuit 120 may switch the second logic signal from the second logic value to the first logic value, in order to notify the controller circuitry 130 that the reset has been completed. As a result, the controller circuitry 130 may switch the first control signal from the first logic value to the second logic value again, in order to start performing a next comparison. By repeatedly performing the above operations, the comparator circuit 120 may repeatedly performing comparisons to generate the decision signals SD. The arrangements between the comparator circuit 120 and the controller circuitry 130 are given for illustrative purposes, and the present disclosure is not limited thereto.

FIG. 2A is a flow chart of operations for generating the statistical noise value according to some embodiments of the present disclosure. In some embodiments, the controller circuitry 130 may perform operations in FIG. 2A, in order to determine the statistical noise value.

In operation S210, during the initial phase, the sampling circuitry is controlled to couple the first input terminal to the second input terminal, in order to generate the sampled signal having the initial level.

Figure 2B:
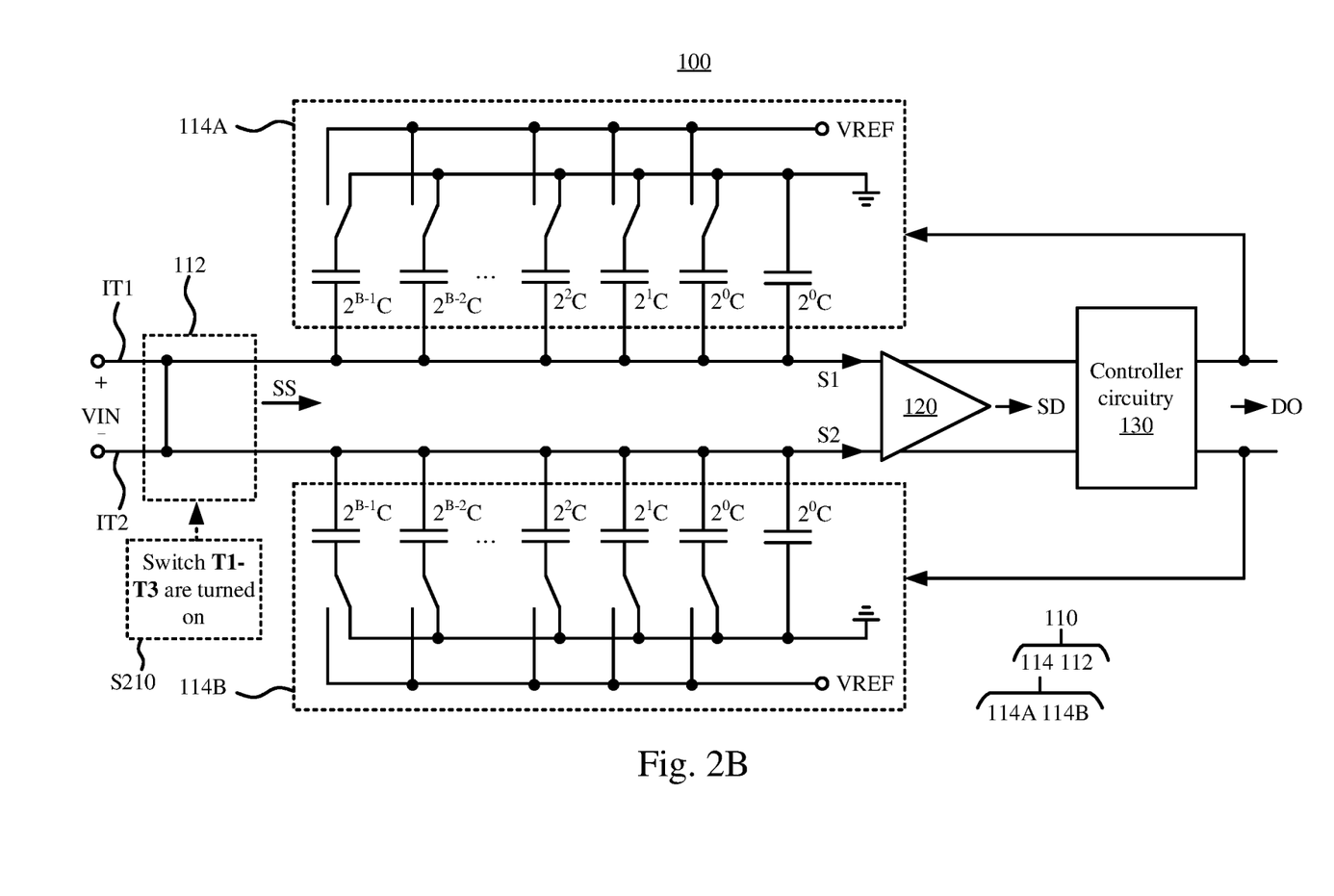
FIG. 2B is a schematic diagram of the SAR analog to digital converter in FIG. 1 performing one operation in FIG. 2A according to some embodiments of the present disclosure.

FIG. 2B is a schematic diagram of the SAR analog to digital converter 100 in FIG. 1 performing operation S210 in FIG. 2A according to some embodiments of the present disclosure. As shown in FIG. 2B, during the initial phase, the switch T1, the switch T2, and the switch T3 are all turned on. Under this condition, the input terminal IT1 and the input terminal IT2 are short-circuited. Accordingly, the switch circuit 112 may output the sampled signal SS having the initial level (which may be, but not limited to, zero) to the digital to analog converter circuit 114. In other words, the digital to analog converter circuit 114 may store the sampled signal SS having the initial level. In some embodiments, the sampling circuitry 110 may employ other arrangements to generate the sampled signal SS having the initial level. For example, during the initial phase, the switch circuit 112 may couple the input terminal IT1 and the input terminal IT2 to a signal source that provides a predetermined level (e.g., the ground voltage or the reference voltage VREF). Various arrangements for generating the initial level are within the contemplated scope of the present disclosure.

With continued reference to FIG. 2A, in operation S220, during the initial phase, a component of the digital to analog converter circuit (which is a capacitor in the examples of FIG. 1) is switched to receive the reference voltage, in order to generate a first signal (e.g., the signal S1) and a second signal (e.g., the signal S2) according to the sampled signal having the initial level.

Figure 2C:
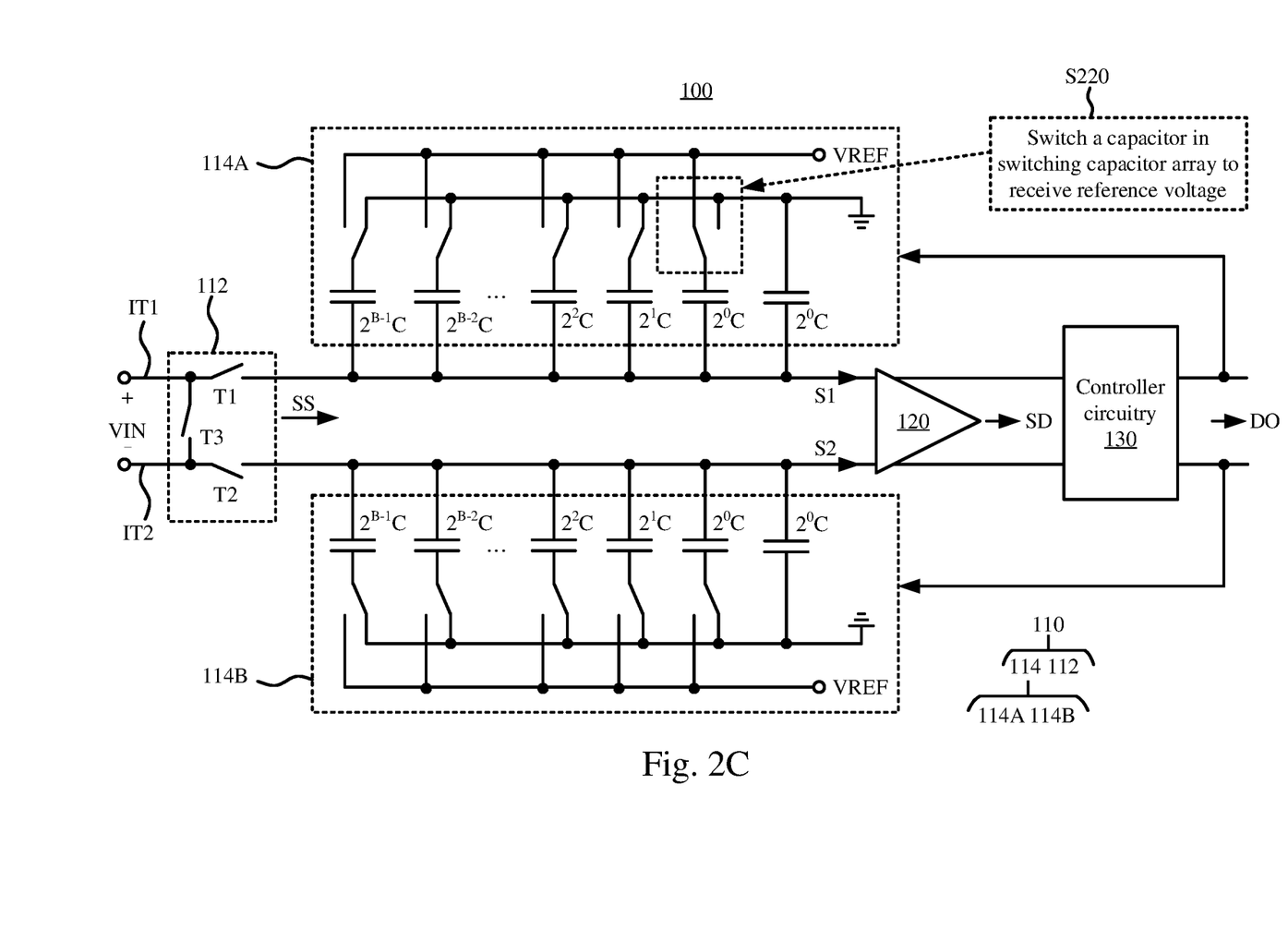
FIG. 2C is a schematic diagram of the SAR analog to digital converter in FIG. 1 performing another one operation in FIG. 2A according to some embodiments of the present disclosure.

FIG. 2C is a schematic diagram of the SAR analog to digital converter 100 in FIG. 1 performing operation S220 in FIG. 2A according to some embodiments of the present disclosure. As shown in FIG. 2C, after the sampled signal SS is stored, the switch T1, the switch T2, and the switch T3 are not turned on. The controller circuitry 130 further switches a component having a lowest weight (e.g., $2^0$) in the switching capacitor array 114A (which may be, for example, a capacitor able to be switched via switch(es)) to receive the reference voltage VREF, in order to generate the signal S1 and the signal S2. With operation S220, the level of the signal S1 (i.e., the level of the first input level of the comparator circuit 120) is shifted by $VREF/2^B$. The arrangements of switching capacitors are given for illustrative purposes, and the present disclosure is not limited thereto. In other embodiments, the controller circuitry 130 may switch one or more capacitors in the switching capacitor array 114A or the switching capacitor array 114B, in order to generate the corresponding signal S1 and signal S2.

With continued reference to FIG. 2A, in operation S230, the comparator circuit is controlled to repeatedly compare the first signal with the second signal, in order to generate the decision signals corresponding to the estimated comparison results. In operation S240, the statistical calculation is performed according to the decision signals corresponding to the estimated comparison results to obtain the statistical noise value.

Figure 2D:
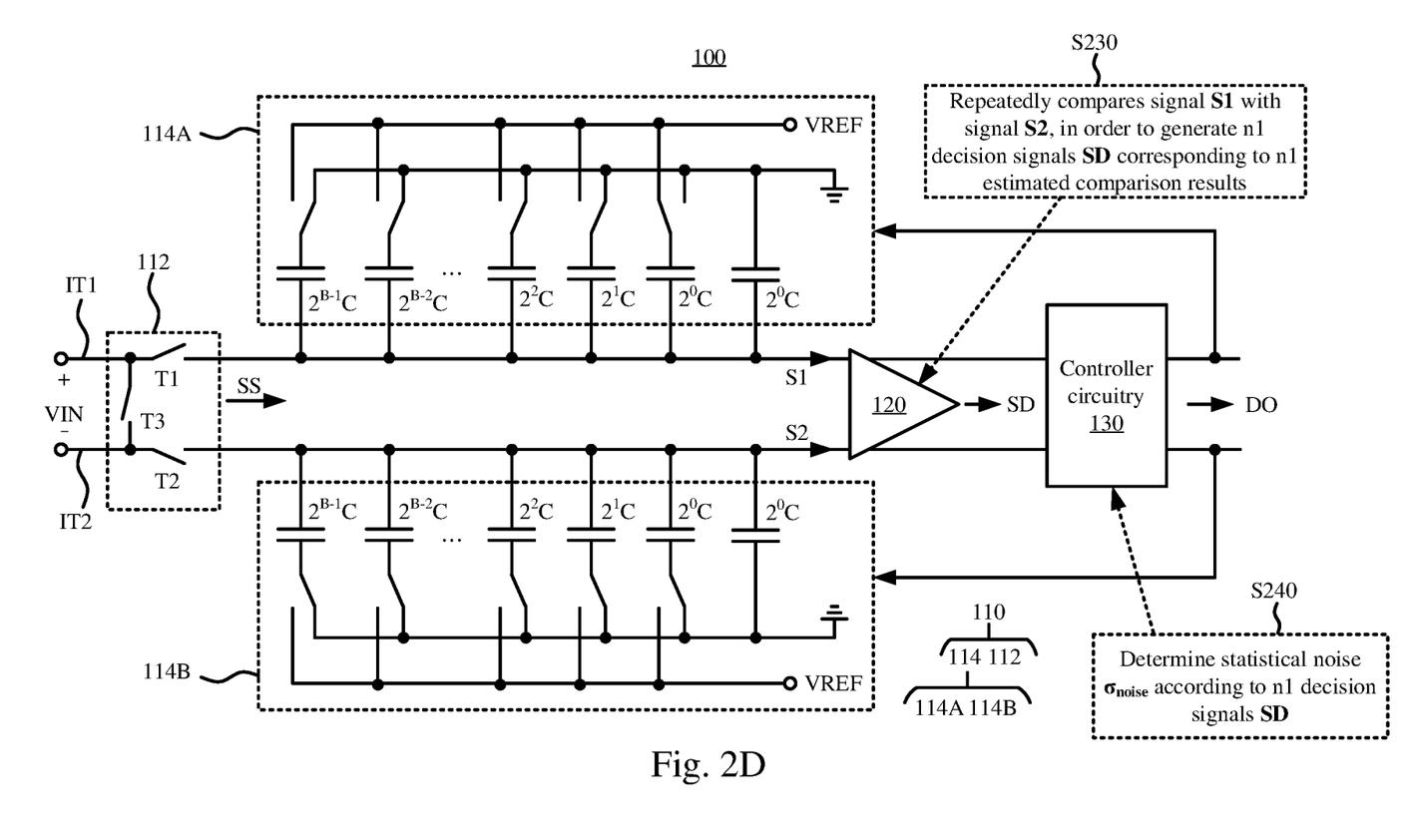
FIG. 2D is a schematic diagram of the SAR analog to digital converter in FIG. 1 performing remaining operations in FIG. 2A according to some embodiments of the present disclosure.

FIG. 2D is a schematic diagram of the SAR analog to digital converter 100 in FIG. 1 performing operation S230 and operation S240 in FIG. 2A according to some embodiments of the present disclosure. As shown in FIG. 2D, based on the control of the controller circuitry 130, the comparator circuit 120 repeatedly compares the signal S1 with the signal S2 by n1 times, in order to generate n1 decision signals SD (which correspond to n1 estimated comparison results for determining the statistical noise value).

In a normal analog to digital conversion, after the digital codes $d_{B-1}$, $d_{B-2}$, . . . , $d_1$ and $d_0$ are generated, there may be residue charge(s) on the digital to analog converter circuit 114, and thus a residue voltage is generated. Such residue voltage may be considered as a quantization error generated from the SAR analog to digital converter 100 converting the sampled signal SS. Moreover, in practical applications, the comparison result may be inaccurate due to impacts from various noises on the comparator circuit 120. In order to improve this problem, the controller circuitry 130 may estimate the statistical noise value with operation S240, in order to estimate the residue voltage. In some embodiments, if the input of the comparator circuit 120 is the sum of the residue voltage and the statistical noise value, the statistical calculation may be employed to determine the probability of the comparator circuit 120 outputting the decision signal SD having the logic value of 1. In some embodiments, the aforementioned statistical calculation may include, but not limited to, a maximum likelihood estimation.

For example, reference is made to a relevant reference document: B. Verbruggen, J. Tsouhlarakis, T. Yamamoto, M. Iriguchi, E. Martens and J. Craninckx, "A 60 dB SNDR 35 MS/s SAR ADC With Comparator-Noise-Based Stochastic Residue Estimation," in IEEE Journal of Solid-State Circuits, vol. 50, no. 9, pp. 2002-2011, September 2015. The equation (1) in the reference document is to estimate the probability of the comparator circuit 120 outputting the decision signal SD having the logic value of 1 in a single comparison based on the maximum likelihood estimation. Based on the equation (1) in the reference document, it can be further derived that the probability of the n1 decision signals SD, which correspond to the n1 comparison results, having the logic value of 1 is satisfied with the following equation (2), in which $V_{res}$ is the residue voltage, $\sigma_{noise}$ is the statistical noise value, k1 is a number of signals having a predetermined logic value (e.g., the logic value of 1) in the n1 decision signals SD, and erf( ) indicates an error function:

$$\frac{k1}{n1} = P(V_{res}, \sigma_{noise}) = \frac{1}{2}\left[1 + \mathrm{erf}\left(\frac{V_{res}}{\sqrt{2}\,\sigma_{noise}}\right)\right]. \tag{2}$$

If the value k1 and the statistical noise value $\sigma_{noise}$ are known, it can be derived that the residue voltage $V_{res}$ is satisfied with the following equation (3) based on the equation (2), in which $\mathrm{erf}^{-1}(\ )$ indicates an inverse error function:

$$V_{res} = \sqrt{2}\,\sigma_{noise} * \mathrm{erf}^{-1}\left(2*\frac{k1}{n1} - 1\right), \tag{3}$$

As mentioned above, during the initial phase, the level of the first input terminal of the comparator circuit 120 is shifted by $VREF/2^B$ (i.e., operation S220), and thus the residue voltage $V_{res}$ in the equation (2) is equal to $VREF/2^B$. Substituting $VREF/2^B$ into the equation (3), the following equation can be derived:

$$\frac{VREF}{2^B} = \tag{4}$$

$$\sqrt{2}\,\sigma_{noise} * \mathrm{erf}^{-1}\left(2*\frac{k1}{n1} - 1\right) \rightarrow \sigma_{noise} = \frac{\frac{VREF}{2^B}}{\sqrt{2}\,\mathrm{erf}^{-1}\left(2*\frac{k1}{n1} - 1\right)}.$$

Accordingly, during the initial phase, the controller circuitry 130 may perform the statistical calculation (e.g., the equation (4)) according to the value n1 and the value of $VREF/2^B$, in order to determine the statistical noise value $\sigma_{noise}$, and store the statistical noise value $\sigma_{noise}$. As a result, the controller circuitry 130 may utilize the statistical noise value $\sigma_{noise}$ to estimate the residue voltage $V_{res}$, in order to generate the complete digital output DO. It should be understood that, the statistical noise value $\sigma_{noise}$ may include information about various noises in the sampling circuitry 110 and the comparator circuit 120. In some embodiments, the various noise may be satisfied with Gaussian distribution.

In the above reference document, the statistical noise value $\sigma_{noise}$ is determined by a simulation. However, in the reference document, the statistical noise value $\sigma_{noise}$ only includes the information about noises in the comparator circuit, and the noise information obtained by simulation cannot fully represent real noises. For example, if process, voltage, operating temperatures in real applications are varied, the statistical noise value $\sigma_{noise}$ will vary accordingly. In other words, the statistical noise value $\sigma_{noise}$ in the above reference document is insufficient to represent the real noise information. Moreover, the reference document requires employing multiple comparator circuits to generate sufficient statistical information.

Compared with the above reference document, in some embodiments of the present disclosure, the statistical noise value $\sigma_{noise}$ is determined during the initial phase of the SAR analog to digital converter 100 (e.g., a time interval after being powered on). In other words, the SAR analog to digital converter 100 may utilize a training process (e.g., operations performed during the initial phase) to calculate the statistical noise value $\sigma_{noise}$ in a practical environment. As a result, more accurate noise information can be obtained. Moreover, in some embodiments of the present disclosure, sufficient statistical information can be generated by using a single comparator circuit 120. As a result, the circuit area and hardware cost are saved.

FIG. 3 is a flow chart of operations for generating the digital output DO in FIG. 1 according to some embodiments of the present disclosure. In some embodiments, the controller circuitry 130 may perform operations in FIG. 3, in order to determine the digital output DO.

In operation S310, a first signal and a second signal are generated according to the sampled signal. In operation S320, the first signal is compared with the second signal, in order to generate decisions signals. In operation S330, first digital codes (e.g., digital code $d_{B-1}$, $d_{B-2}$, . . . , $d_1$, and $d_0$) are generated according to the decision signals.

For example, the switch T1 and the switch T2 are turned on, and the switch T3 is not turned on. Under this condition, the switch circuit 112 may output the input signal VIN to be the sampled signal SS. In response to the sampled signal SS, the switching capacitor array 114A and the switching capacitor array 114B generate different signals S1 and S2. The comparator circuit 120 may compare the signal S1 with the signal S2 to generate the decision signal SD. In response to this decision signal SD, the controller circuitry 130 generates the digital code $d_{B-1}$, and switches at least one of the switching capacitor array 114A and/or the switching capacitor array 114B. As a result, the switching capacitor array 114A and the switching capacitor array 114B may update the signal S1 and the signal S2, and the comparator circuit 120 may compare the signal S1 and the signal S2 again to generate a new decision signal SD. In response to this decision signal SD, the controller circuitry 130 generates the digital code $d_{B-2}$, and switches at least one of the switching capacitor array 114A and/or the switching capacitor array 114B. By this analogy, the controller circuitry 130 may generate digital codes $d_{B-1}$, $d_{B-2}$, . . . $d_1$, and $d_0$ according to the decision signals SD.

In operation S340, the comparator circuit is controlled to repeatedly compare the first signal with the second signal, in order to generate the decision signals corresponding to the output comparison results. In operation S350, a second digital code is determined according to the decision signals corresponding to the output comparison results and the statistical noise value.

For example, after the digital codes $d_{B-1}$, $d_{B-2}$, . . . , $d_1$, and $d_0$ are generated, a residue voltage $V_{res}$ may be on the digital to analog converter circuit 114. In other words, after the digital codes $d_{B-1}$, $d_{B-2}$, . . . , $d_1$, and $d_0$ are generated, the signal S1 and the signal S2 generated from the digital to analog converter circuit 114 can be utilized to indicate the residue voltage $V_{res}$. The controller circuitry 130 may control the comparator circuit 120 to repeatedly compare the signal S1 with the signal S2, in order to generate n2 decision signals SD corresponding to n2 output comparison results. With reference to the above equation (3), the controller circuitry 130 may utilize the value k2 to perform the statistical calculation (i.e., maximum likelihood estimation) to obtain the residue voltage $V_{res}$ (e.g., the following equation (5)), in which the value k2 is a number of signals having the predetermined logic value (e.g., the logic value of 1) in the n2 decision signals SD:

$$V_{res} = \sqrt{2}\,\sigma_{noise} * \text{erf}^{-1}\left(2*\frac{k2}{n2} - 1\right), \quad (5)$$

Furthermore, the controller circuitry 130 may utilize the following equation (6) to convert the residue voltage $V_{res}$ into the second digital code $D_{res}$, in which the second digital code $D_{res}$ may be a multi-bit signal:

$$D_{res} = \frac{V_{res}}{VREF}. \quad (6)$$

In operation S360, the first digital codes and the second digital code are combined to generate the digital output. For example, the controller circuitry 130 may combine the digital codes $d_{B-1}$, $d_{B-2}$, ..., $d_1$, and $d_0$ (expressed as $d_{B-1} d_{B-2} \ldots d_1 d_0$), and sum up the combined digital code and the second digital code $D_{res}$ to generate the digital output DO, which can be expressed as the following equation (7):

$$DO = d_{B-1} d_{B-2} \ldots d_1 d_0 + D_{res} \quad (7).$$

With the above operations, the resolution of the SAR analog to digital converter 100 can be effectively increased. For example, in an experimental example, if the SAR analog to digital converter 100 does not employ the aforementioned statistical calculation or other calibration, a signal-to-noise ratio of the digital output DO is about 51.7 dB. With the above operations, signal-to-noise ratio of the digital output DO is increased to be about 55.3 dB.

The arrangements of the SAR analog to digital converter 100 are given for illustrative purposes, and the present disclosure is not limited thereto. In other embodiments, the controller circuitry 130 may perform a non-binary search algorithm to perform the analog to digital conversion. In some embodiments, the controller circuitry 130 may utilize the digital signal processing, look-up table, or other suitable arrangements to perform the statistical calculation. In some embodiments, the digital to analog converter circuit 114 may be other types of digital to analog converter circuits. For example, the digital to analog converter circuit 114 may be a resistive digital to analog converter circuit, a current digital to analog converter circuit, or the like.

Figure 4:
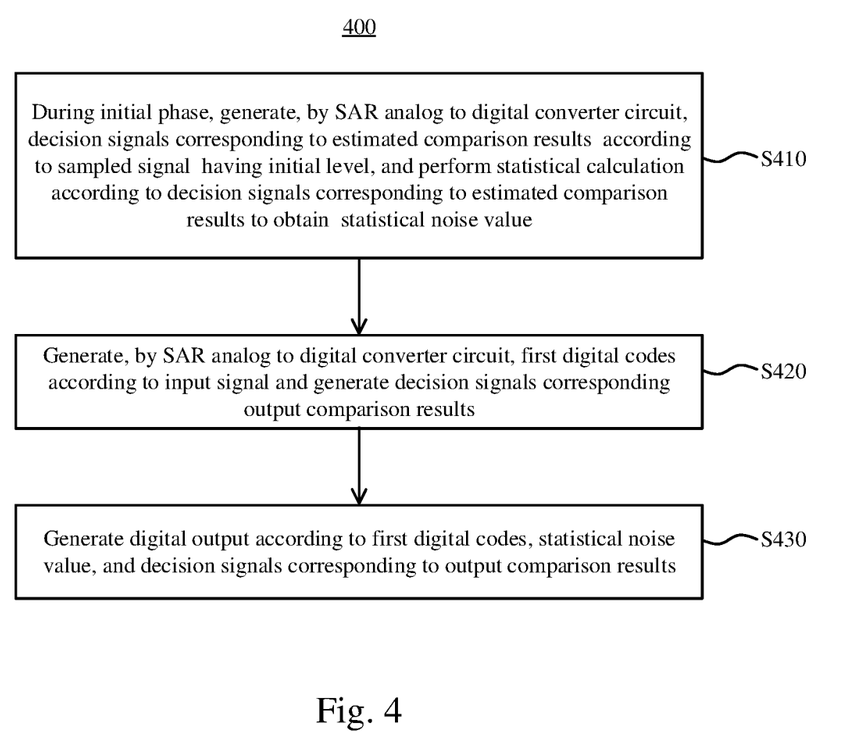
FIG. 4 is a flow chart of a signal conversion method according to some embodiments of the present disclosure.

FIG. 4 is a flow chart of a signal conversion method 400 according to some embodiments of the present disclosure. In operation S410, during the initial phase, decision signals corresponding to estimated comparison results are generated by a SAR analog to digital converter circuit according to a sampled signal having the initial level, and a statistical calculation is performed according to the decision signals corresponding to the estimated comparison results to obtain a statistical noise value. In operation S420, first digital codes are generated by the SAR analog to digital converter circuit according to an input signal, and decision signals corresponding output comparison results are generated. In operation S430, a digital output is generated according to the first digital codes, the statistical noise value, and the decision signals corresponding to the output comparison results.

The above operations can be understood with reference to above embodiments, and thus the repetitious descriptions are not further given. The above description of the signal conversion method 400 includes exemplary operations, but the operations of the signal conversion method 400 are not necessarily performed in the order described above. Operations of the signal conversion method 400 can be added, replaced, changed order, and/or eliminated, or the operations of the signal conversion method 400 can be executed simultaneously or partially simultaneously as appropriate, in accordance with the spirit and scope of various embodiments of the present disclosure.

As described above, the SAR analog to digital converter and the signal conversion method in some embodiments of the present disclosure may determine information about actual noises during a time interval after the device is powered on, and may utilize such information to perform a statistical calculation without excessive hardware costs, in order to effectively increase the resolution of the SAR analog to digital converter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A successive approximation register analog to digital converter, comprising:
   a sampling circuitry configured to generate a first signal and a second signal according to a sampled signal;
   a comparator circuit configured to compare the first signal with the second signal, in order to generate a plurality of decision signals; and
   a controller circuitry configured to generate a plurality of first digital codes according to the plurality of decision signals, and control the comparator circuit to generate the plurality of decision signals corresponding to a plurality of output comparison results, in order to generate a digital output according to the plurality of first digital codes, a statistical noise value, and the plurality of decision signals corresponding to the plurality of output comparison results,
   wherein during an initial phase, the controller circuitry is further configured to control the sampling circuitry and the comparator circuit, such that the comparator circuit generates the plurality of decision signals corresponding to a plurality of estimated comparison results according to the sampled signal having an initial level, and the controller circuitry performs a statistical calculation according to the plurality of decision signals corresponding to the plurality of estimated comparison results, in order to obtain the statistical noise value.

2. The successive approximation register analog to digital converter of claim 1, wherein the sampling circuitry is configured to receive an input signal via a first input terminal and a second input terminal to generate the sampled signal, and is further configured to couple the first input terminal to the second input terminal during the initial phase, in order to generate the sampled signal having the initial level.

3. The successive approximation register analog to digital converter of claim 1, wherein the sampling circuitry comprises a digital to analog converter circuit, and during the initial phase, the controller circuitry is configured to switch a component of the digital to analog converter circuit to receive a reference voltage to generate the first signal and the second signal according to the sampled signal having the initial level, and control the comparator circuit to repeatedly compare the first signal with the second signal to generate the plurality of decision signals corresponding to the plurality of estimated comparison results.

4. The successive approximation register analog to digital converter of claim 3, wherein the component is a component having a lowest weight in the digital to analog converter circuit.

5. The successive approximation register analog to digital converter of claim 1, wherein the statistical calculation is a maximum likelihood estimation.

6. The successive approximation register analog to digital converter of claim 1, wherein the controller circuitry is configured to perform the statistical calculation according to a value to determine the statistical noise value, and the value is a number of signals having a predetermined logic value in the plurality of decision signals corresponding to the plurality of estimated comparison results.

7. The successive approximation register analog to digital converter of claim 1, wherein the controller circuitry is configured to control the comparator circuit to repeatedly compare the first signal with the second signal after the plurality of first digital codes are generated, in order to generate the plurality of decision signals corresponding to the plurality of output comparison results.

8. The successive approximation register analog to digital converter of claim 1, wherein the controller circuitry is configured to determine a second digital code according to a value and the statistical noise value, and combine the plurality of first digital code and the second digital code to generate the digital output, and the value is a number of signals having a predetermined logic value in the plurality of decision signals corresponding to the plurality of output comparison results.

9. The successive approximation register analog to digital converter of claim 8, wherein the controller circuitry is configured to perform a statistical calculation according to the value and the statistical noise value, in order to determine the second digital code.

10. The successive approximation register analog to digital converter of claim 1, wherein the initial level is zero.

11. The signal conversion method of claim 10, wherein the statistical calculation is a maximum likelihood estimation.

12. A signal conversion method, comprising:
during an initial phase, generating, by a successive approximation register analog to digital converter, a plurality of decision signals corresponding to a plurality of estimated comparison results according to a sampled signal having an initial level, and performing a statistical calculation according to the plurality of decision signals corresponding to the plurality of estimated comparison results, in order to obtain a statistical noise value;
generating, by the successive approximation register analog to digital converter, a plurality of first digital codes and generating the plurality of decision signals corresponding to a plurality of output comparison results; and
generating a digital output according to the plurality of first digital codes, the statistical noise value, and the plurality of decision signals corresponding to the plurality of output comparison results.

13. The signal conversion method of claim 12, wherein the successive approximation register analog to digital converter comprises a first input terminal and a second input terminal which are configured to receive an input signal, and the signal conversion method further comprises:
coupling the first input terminal to the second input terminal during the initial phase, in order to generate the sampled signal having the initial level.

14. The signal conversion method of claim 12, wherein the initial level is zero.

15. The signal conversion method of claim 12, wherein the successive approximation register analog to digital converter comprises a digital to analog converter circuit and a comparator circuit, and during the initial phase, generating, by the successive approximation register analog to digital converter, the plurality of decision signals corresponding to the plurality of estimated comparison results according to the sampled signal having the initial level comprise:
during the initial phase, switching a component of the digital to analog converter circuit to receive a reference voltage, in order to generate the first signal and the second signal according to the sampled signal having the initial level; and
controlling the comparator circuit to repeatedly compare the first signal with the second signal to generate the plurality of decision signals corresponding to the plurality of estimated comparison results.

16. The signal conversion method of claim 15, wherein the component is a component having a lowest weight in the digital to analog converter circuit.

17. The signal conversion method of claim 12, performing the statistical calculation according to the plurality of decision signals corresponding to the plurality of estimated comparison results, in order to obtain the statistical noise value comprises:
performing the statistical calculation according to a value to determine the statistical noise value, wherein the value is a number of signals having a predetermined logic value in the plurality of decision signals corresponding to the plurality of estimated comparison results.

18. The signal conversion method of claim 12, wherein the successive approximation register analog to digital converter comprises a comparator circuit, and generating the plurality of decision signals corresponding to the plurality of output comparison results comprises:
controlling the comparator circuit to repeatedly compare the first signal with the second signal after the plurality of first digital codes are generated, in order to generate the plurality of decision signals corresponding to the plurality of output comparison results.

19. The signal conversion method of claim 12, wherein generating the digital output according to the plurality of first digital codes, the statistical noise value, and the plurality of decision signals corresponding to the plurality of output comparison results comprises:

determining a second digital code according to a value and the statistical noise value, wherein the value is a number of signals having a predetermined logic value in the plurality of decision signals corresponding to the plurality of output comparison results; and     combining the plurality of first digital code and the second digital code to generate the digital output.

20. The signal conversion method of claim 19, wherein determining the second digital code according to the value and the statistical noise value comprises:

performing a statistical calculation according to the value and the statistical noise value, in order to determine the second digital code.

\* \* \* \* \*